(12) United States Patent
Yu et al.

(10) Patent No.: US 8,823,117 B2
(45) Date of Patent: Sep. 2, 2014

(54) MAGNETIC DEVICE FABRICATION

(75) Inventors: Chewn Yu, Taipei (TW); Tien-Wei Chiang, Hsin-Chu (TW); Kai-Wen Cheng, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 5 days.

(21) Appl. No.: 13/314,454

(22) Filed: Dec. 8, 2011

(65) Prior Publication Data
US 2013/0146996 A1     Jun. 13, 2013

(51) Int. Cl.
*H01L 29/72* (2006.01)
(52) U.S. Cl.
USPC ............ 257/421; 257/E29.323; 257/E21.002

(58) Field of Classification Search
USPC ............................ 257/421, E29.323, E21.002
See application file for complete search history.

(56) References Cited

U.S. PATENT DOCUMENTS

| 2005/0199926 A1* | 9/2005 | Fukuzumi et al. ............ 257/295 |
| 2012/0146166 A1* | 6/2012 | Levi et al. .................... 257/421 |

* cited by examiner

*Primary Examiner* — Edward Wojciechowicz
(74) *Attorney, Agent, or Firm* — Haynes and Boone, LLP

(57) ABSTRACT

The present disclosure provides for magnetic devices and methods of fabricating such a device. In one embodiment, a magnetic device includes a first elliptical pillar of first material layers; a second elliptical pillar concentrically disposed over the first elliptical pillar, the second elliptical pillar includes second material layers. The second elliptical pillar is smaller than the first elliptical pillar in size.

19 Claims, 8 Drawing Sheets

US 8,823,117 B2

MAGNETIC DEVICE FABRICATION

BACKGROUND

Magnetization switching using magnetic fields produced by current lines has been previously used for magnetic information storage or magnetic random access memory (MRAM) technology. More recently, magnetization switching by spin-polarized current (or by a mechanism called spin transfer) has been demonstrated for MRAM technology. A magnetic logic gate may also be formed. However, fabricating elliptical pillars by hard mask and etching has provided inconsistent structures with inconsistent shape and reduced yields.

BRIEF DESCRIPTION OF THE DRAWINGS

Aspects of the present disclosure are understood from the following detailed description when read with the accompanying figures. It is emphasized that, in accordance with the standard practice in the industry, various features may not be drawn to scale. In fact, the dimensions of the various features may be arbitrarily increased or reduced for clarity of discussion.

DETAILED DESCRIPTION

Figure 1A:
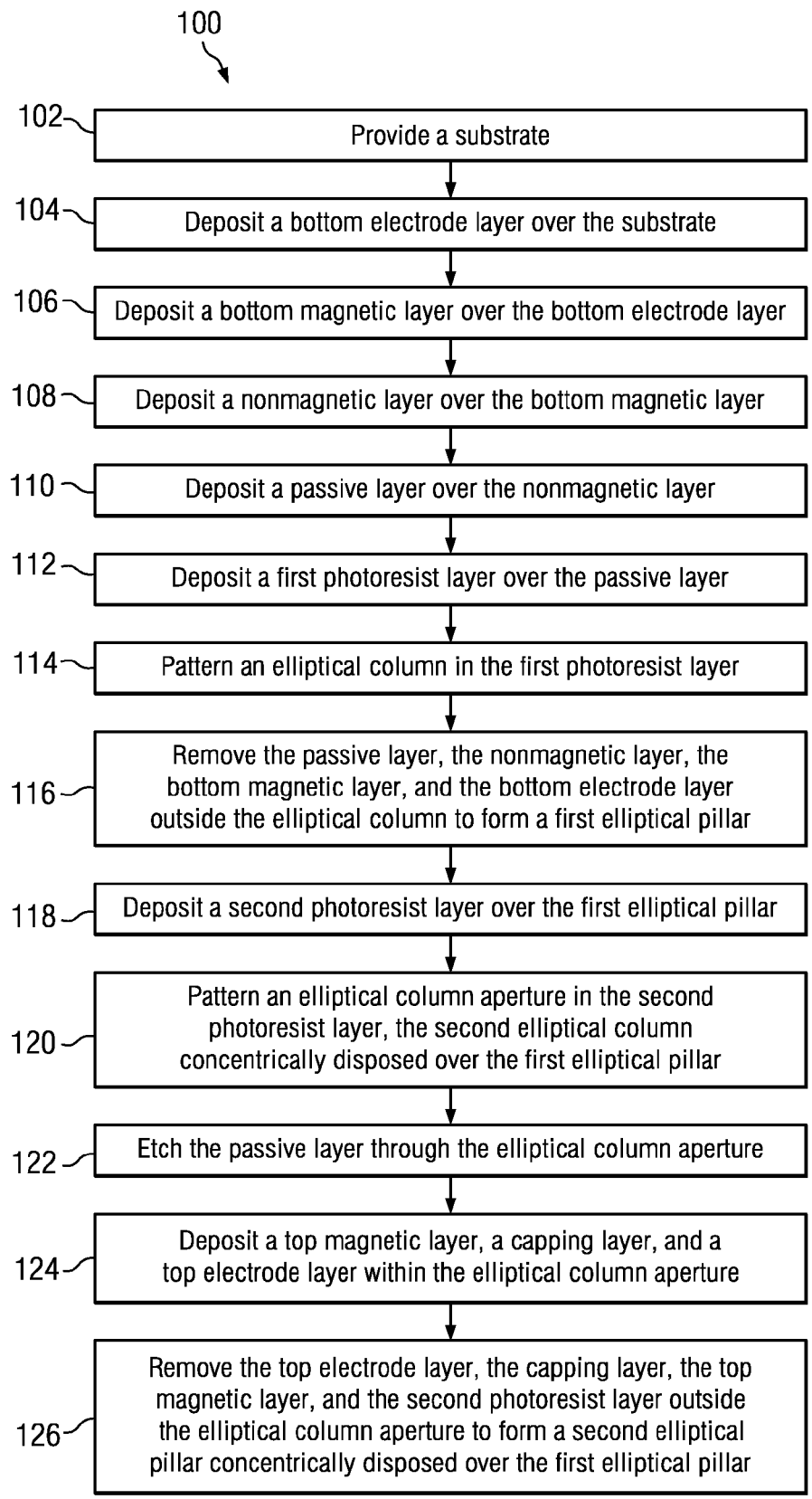
FIGS. 1A and 1B are flowcharts of methods of fabricating a magnetic device in accordance with an embodiment of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity. It is noted that the same or similar features may be similarly numbered herein for the sake of simplicity and clarity. In addition, some of the drawings may be simplified for clarity. Thus, the drawings may not depict all of the components of a given apparatus (e.g., device) or method.

Various aspects of the present disclosure will be described herein with reference to drawings that are schematic illustrations of idealized configurations of the present disclosure. As such, variations from the shapes of the illustrations as a result, for example, manufacturing techniques and/or tolerances, are to be expected. Thus, the various aspects of the present disclosure presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings may be schematic in nature and their shapes may not be intended to illustrate the precise shape of an element and may not be intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on", "directly contacts", or "in direct contact with" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top", may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" sides of the other elements. The term "lower", can therefore, encompass both an orientation of "lower" and "upper", depending on the particular orientation of the apparatus. Similarly, if an apparatus in the drawing is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items It will be understood that although the terms "first" and "second" may be used herein to describe various regions, layers, portions, and/or sections, these regions, layers, portions, and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present disclosure.

It is understood that several processing steps and/or features of a device may be only briefly described, such steps and/or features being well known to those of ordinary skill in the art. Also, additional processing steps or features can be added, and certain of the following processing steps or features can be removed and/or changed while still implementing the claims. Thus, the following description should be understood to represent examples only, and are not intended to suggest that one or more steps or features is required.

Referring now to FIG. 1A, a flowchart is shown illustrating a method 100 for fabricating a magnetic device. At block 102 a substrate is provided, and at block 104 a bottom electrode layer is deposited over the substrate. At block 106 a bottom magnetic layer is deposited over the bottom electrode layer, and at block 108 a nonmagnetic layer is deposited over the bottom magnetic layer. At block 110 a passive layer is deposited over the nonmagnetic layer, and at block 112 a first photoresist layer is deposited over the passive layer. At block 114 an elliptical column is patterned in the first photoresist layer, and at block 116 the passive layer, the nonmagnetic layer, the bottom magnetic layer, and the bottom electrode layer outside the elliptical column are removed to form a first elliptical pillar.

At block 118 a second photoresist layer is deposited over the first elliptical pillar, at block 120 an elliptical column aperture is patterned in the second photoresist layer, the elliptical column aperture being concentrically disposed over the first elliptical pillar. At block 122 the passive layer is etched through the elliptical column aperture, and at block 124 a top magnetic layer, a capping layer, and a top electrode layer are deposited within the elliptical column aperture. At block 126, the top electrode layer, the capping layer, the top magnetic layer, and the second photoresist layer outside the elliptical column aperture are removed to form a second elliptical pillar concentrically disposed over the first elliptical pillar. In one embodiment, a lift-off process is implemented. In the lift-off process, a stripping process is applied to remove the second photoresist layer and the various material layers formed on the second photoresist layer are removed accordingly.

Figure 1B:
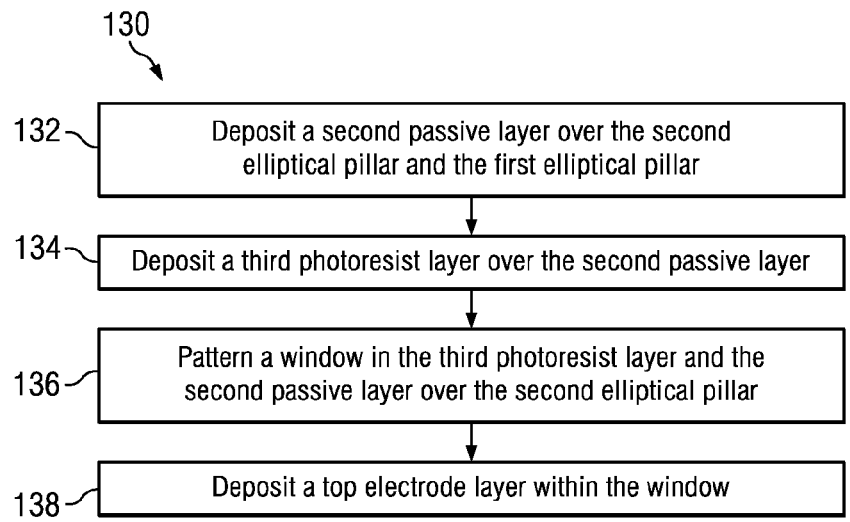

Referring now to FIG. 1B, a flowchart is shown illustrating a method 130 for further fabricating a magnetic device. At block 132, a second passive layer is deposited over the second elliptical pillar and the first elliptical pillar of method 100. At block 134, a third photoresist layer is deposited over the second passive layer. At block 136, a window is patterned in the third photoresist layer and the second passive layer over the second elliptical pillar. At block 138, a top electrode layer is deposited within the window.

The various structures in methods 100 and 130 described above may be formed by various applicable techniques, such as deposition, pattern, and/or etch techniques. In one embodiment, the methods of fabrication described above may be used to fabricate a magnetic memory device, such as a magnetoresistive random access memory (MRAM) cell, or a magnetic logic device. In one embodiment, the magnetic device may include a magnetic tunnel junction (MTJ) device when the nonmagnetic layer is an insulator layer, such as a nonmagnetic layer comprised of an oxide. In another embodiment, the magnetic device may include a spin valve device when the nonmagnetic layer is a metal layer, such as a nonmagnetic layer comprised of copper.

It should be noted that the operations of method 100 may be rearranged or otherwise modified within the scope of the various aspects. It is further noted that additional processes may be provided before, during, and after method 100 of FIG. 1, and that some other processes may only be briefly described herein. Thus, other implementations are possible within the scope of the various aspects described herein.

According to one aspect of the present disclosure, method 100 may further include wherein the bottom magnetic layer is deposited to form a pinned ferromagnetic layer and the top magnetic layer is deposited to form a free ferromagnetic layer. In one example, the bottom magnetic layer may be deposited to a thickness between about 20 angstroms and about 80 angstroms, and the top magnetic layer may be deposited to a thickness between about 10 angstroms and about 40 angstroms.

According to another aspect, the bottom magnetic layers may be comprised of an antiferromagnetic layer and a synthetic GMR structure. For example, the bottom magnetic layers may be comprised of a pinned layer (e.g., PtMn (100 Å~300 Å), a synthetic GMR structure (e.g., CoFe or CoFeB or CoFe/CoFeB (10 Å~50 Å)/Ru (6 Å~10 Å)/CoFe or CoFeB or CoFe/CoFeB (10 Å~50 Å)).

According to another aspect, method 100 may further include wherein the second elliptical pillar is formed to have major and minor axes smaller than the major and minor axes of the first elliptical pillar.

According to yet another aspect, method 100 may further include wherein depositing of the nonmagnetic layer includes depositing an insulator material or a metal to a thickness between about 6 angstroms and about 30 angstroms.

According to yet another aspect, method 100 may further include wherein depositing of the passive layer includes depositing a dielectric material having a thickness between about 2 angstroms and about 5 angstroms.

According to yet another aspect, method 100 may further include wherein patterning the elliptical column is performed by lithographically exposing a first elliptical shape on the first photoresist layer and developing the exposed first photoresist layer, and wherein patterning the elliptical column aperture is performed by lithographically exposing a second elliptical shape on the second photoresist layer and developing the exposed second photoresist layer.

According to yet another aspect, method 100 may further include wherein the top magnetic layer is deposited to be in direct contact with the nonmagnetic layer through an aperture in the passive layer.

According to yet another aspect, method 100 may further include wherein depositing of the capping layer includes depositing an oxide material or a metal to a thickness between about 6 angstroms and about 30 angstroms.

According to yet another aspect, method 100 may further include wherein the substrate is provided to include a first input current lead, a second input current lead, and a bottom voltage lead, and the leads are in direct contact with the bottom electrode.

According to yet another aspect, method 100 may further include depositing a bottom buffer layer over the bottom electrode layer, and/or depositing an antimagnetic layer over the bottom buffer layer.

Figure 2A:
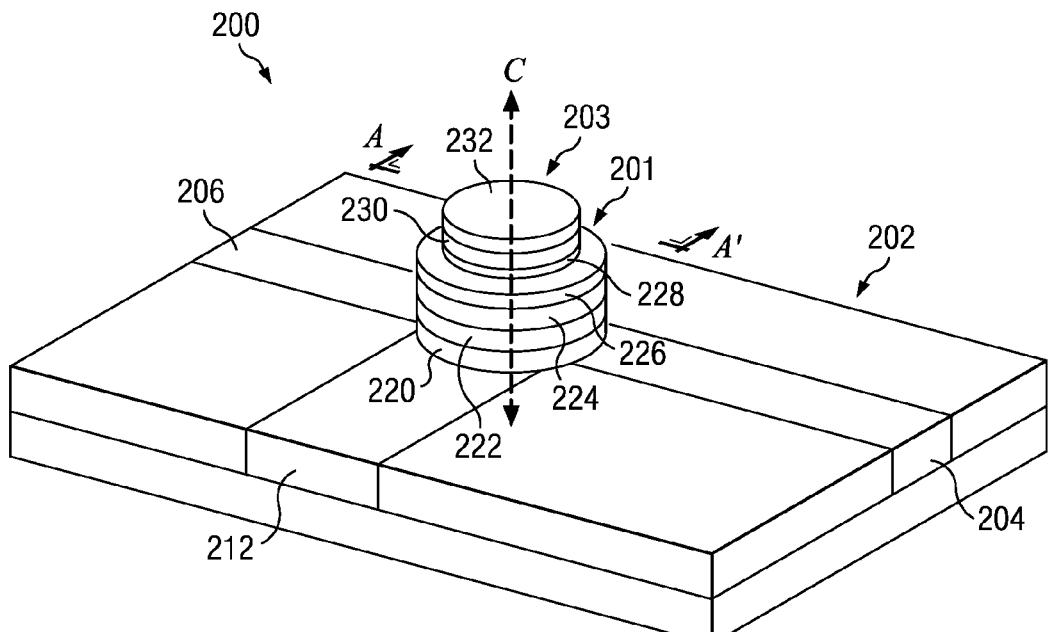
FIGS. 2A and 2B are a perspective view and a cross-sectional view, respectively, of a magnetic device in accordance with an embodiment of the present disclosure.
Figure 2B:
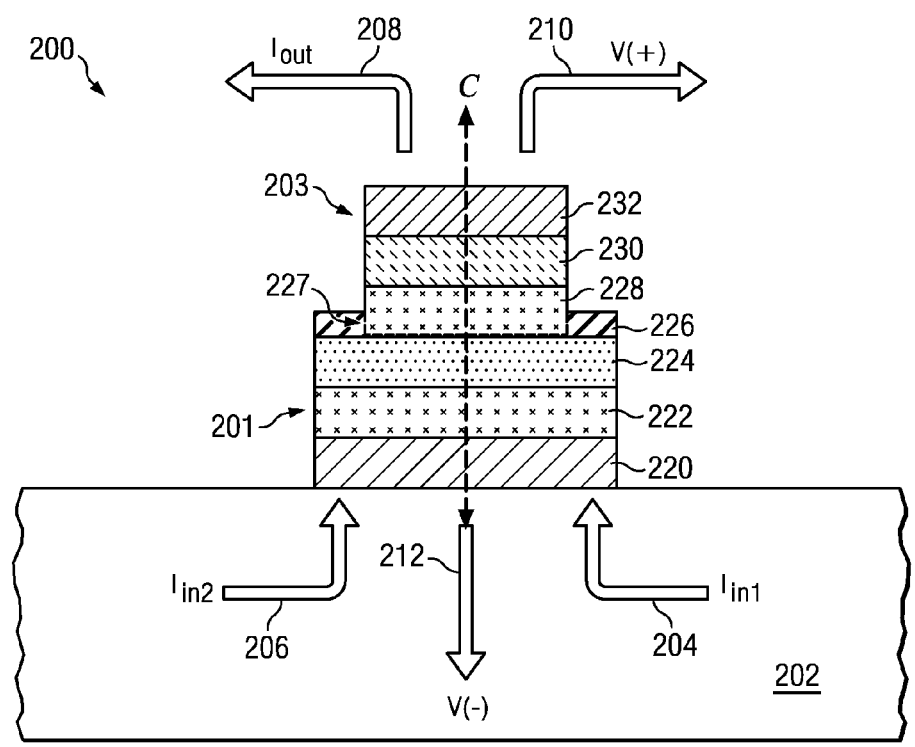

Referring now to FIGS. 2A and 2B, FIG. 2A illustrates a perspective view of a magnetic device 200 in accordance with an embodiment of the present disclosure, and FIG. 2B illustrates a cross-sectional view of magnetic device 200 along a line A-A' in FIG. 2A in accordance with an embodiment of the present disclosure.

Magnetic device 200 includes, in one example, a first elliptical pillar 201 and a second elliptical pillar 203 concentrically disposed over the first elliptical pillar 201, for example along a concentric axis C. The first elliptical pillar 201 includes a bottom electrode 220, a bottom magnetic layer 222 disposed over the bottom electrode 220, a nonmagnetic layer 224 disposed over the bottom magnetic layer 222, and a passive layer 226 disposed over the nonmagnetic layer 224. The second elliptical pillar 203 includes a top magnetic layer 228 disposed over the nonmagnetic layer 224, a capping layer 230 disposed over the top magnetic layer 228, and a top electrode 232 disposed over the capping layer 230.

According to one aspect of the present disclosure, the first elliptical pillar 201 and the second elliptical pillar 203 may be formed on a substrate 202 including a first input current lead 204, a second input current lead 206, and a bottom voltage lead 212, wherein the leads are operably coupled to bottom electrode 220. According to another aspect, an output current lead 208 and a top voltage lead 210 may be operably coupled to top electrode 232.

According to yet another aspect, the bottom magnetic layer 222 of device 200 may be a pinned ferromagnetic layer having a thickness between about 20 angstroms and about 80 angstroms, and/or the top magnetic layer 228 may be a free ferromagnetic layer having a thickness between about 10 angstroms and about 40 angstroms.

According to yet another aspect, the second elliptical pillar 203 has smaller major and minor axes than the first elliptical pillar 201.

According to yet another aspect, the nonmagnetic layer 224 may be comprised of an insulator material or a metal having a thickness between about 6 angstroms and about 30 angstroms, and/or the passive layer 226 may be comprised of a dielectric material having a thickness between about 2 angstroms and about 5 angstroms.

According to yet another aspect, the top magnetic layer 228 may be in direct contact with the nonmagnetic layer 224 through an aperture 227 in the passive layer 226, and/or the top magnetic layer 228 may have a thickness greater than the passive layer 226.

According to yet another aspect, the capping layer 230 may be comprised of an oxide material or a metal having a thickness between about 6 angstroms and about 30 angstroms.

According to yet another aspect, device 200 may further include a bottom buffer layer (not shown) disposed over the bottom electrode 220, and/or an antimagnetic layer (not shown) disposed over the bottom buffer layer.

As noted above, magnetic device 200 includes, in one example, bottom electrode 220 which is configured to receive a first input current and a second input current (e.g., shown by inbound arrows $I_{in1}$ and $I_{in2}$). The top electrode 232 and the bottom electrode 220 may be configured to provide an output voltage (e.g., shown by outbound arrows V(+) and V(−)) which is dependent on the first and second input currents and which follows an AND gate logic or an OR gate logic. In other embodiments, device 200 may be configured to be a magnetic memory device, such as a magnetoresistive random access memory (MRAM) cell, in which electrical resistance of the cell may be measured for reading data and/or a toggle mode, spin-transfer torque, or other applicable method is used for writing data.

In one example, the bottom electrode 220 may be comprised of a nonmagnetic metal or alloy (e.g., Al or Ti or alloys thereof), the bottom buffer layer may be comprised of a metal or insulator and have a thickness between about 5 Å and about 300 Å, the antimagnetic layer may be comprised of an antiferromagnetic material and have a thickness between about 10 Å and about 300 Å, the bottom magnetic layer 222 may be comprised of ferromagnetic metal or alloy (e.g., CoFeB or NiFe) and have a thickness between about 20 Å and about 80 Å, the nonmagnetic layer 224 may be comprised of either a metal or alloy (for the case of a spin valve device) or insulator material (e.g., an oxide such as MgO, NiO, TiO, or AlO) (for the case of a magnetic tunnel junction device) and have a thickness between about 6 Å and about 30 Å, the passive layer 226 may be comprised of a dielectric material having a thickness between about 2 Å and about 5 Å, the top magnetic layer 228 may be comprised of ferromagnetic metal or alloy (e.g., CoFeB or NiFe) and have a thickness between about 10 Å and about 40 Å, the capping layer may be comprised of a metal or insulator and have a thickness between about 6 Å and about 30 Å, and the top electrode 232 may be comprised of a nonmagnetic metal or alloy (e.g., Al or Ti or alloys thereof) and have a thickness between about 20 Å and about 500 Å.

In another example, the bottom and top magnetic layers 222, 228 may each be comprised of a single ferromagnetic metal or alloy layer, or the layers 222, 228 may each be comprised of multiple layers. In another example, the bottom magnetic layer 222 may have a thickness greater than top magnetic layer 228.

According to one aspect, bottom electrode 220 is disposed over substrate 202, which may include bottom electrode 220 disposed over a surface of substrate 202. In one example, substrate 202 may include a first input current lead 204 for receiving a first input current $I_{in1}$, a second input current lead 206 for receiving a second input current $I_{in2}$, and a bottom voltage lead 212. Other applicable configurations of the leads for bottom electrode 220 are within the scope of the present disclosure.

In one aspect, the first and second input currents may be provided by one or more current sources providing AC or DC current pulses in one example, but may include any of various current sources for providing current. In one example, a current source may further include a power supply regulator and/or a diode bridge. In another example, a current source may provide a current greater than or less than a critical current required to switch the magnetization direction of the top magnetic layer 228.

In one aspect, substrate 202 may include various semiconductor devices, and/or other suitable active and/or passive devices. Example semiconductor devices include integrated circuits including a metal-insulator-semiconductor field effect transistor (MOSFET) including complementary MOSFET (CMOS) features, CIS, and/or other suitable active and/or passive devices. In an embodiment, the substrate may include an integrated circuit (or portion thereof) designed and formed using a CMOS-based process. A substrate having a device (e.g., integrated circuit) formed by other semiconductor fabrication technologies is also within the scope of the described method.

In one embodiment, substrate 202 may include a semiconductor substrate, and may be comprised of silicon, or alternatively may include silicon germanium, gallium arsenic, or other suitable semiconductor materials. The substrate may further include doped active regions and other features such as a buried layer, and/or an epitaxy layer. Furthermore, the substrate may be a semiconductor on insulator such as silicon on insulator (SOI). In other embodiments, the semiconductor substrate may include a doped epitaxy layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure. The active region may be configured as an NMOS device (e.g., nFET) or a PMOS device (e.g., pFET). The semiconductor substrate may include underlying layers, devices, junctions, and other features (not shown) formed during prior process steps or which may be formed during subsequent process steps.

In one example, a bottom buffer layer disposed over bottom electrode 220 may be comprised of a nonmagnetic metal or alloy (e.g., aluminum or titanium) and have a thickness between about 20 Å and about 80 Å.

In one example, an antimagnetic layer disposed over the bottom buffer layer may be comprised of an antiferromagnetic material and have a thickness between about 10 Å and about 300 Å. The antimagnetic layer may be exchange-coupled to the bottom magnetic layer 222 to pin or fix the magnetization direction of bottom magnetic layer 222. However, the antimagnetic layer may be optional as bottom magnetic layer 222 may have its magnetization direction pinned or fixed by virtue of being fabricated with a greater thickness in one example.

In one example, the bottom magnetic layer 222 is comprised of ferromagnetic metal or alloy (e.g., CoFeB or NiFe) and may have a thickness between about 20 Å and about 80 Å. In another example, bottom magnetic layer 222 is a bottom ferromagnetic layer comprised of CoFeB. As noted above, in this embodiment, bottom magnetic layer 222 has a magnetization direction which is pinned or fixed by virtue of being fabricated with a greater thickness or by being exchange coupled with an antimagnetic layer.

In one example, the nonmagnetic layer 224 (which may also be referenced as a spacer layer) disposed over bottom magnetic layer 222 is comprised of either a metal or alloy (for the case of a spin valve device) or insulator material (e.g., an oxide such as MgO, NiO, TiO, or AlO) (for the case of a magnetic tunnel junction device) and may have a thickness between about 6 Å and about 30 Å.

In one example, the top magnetic layer 228 disposed over nonmagnetic layer 224 through passive layer 226 is comprised of ferromagnetic metal or alloy (e.g., CoFeB, or NiFe) and may have a thickness between about 10 Å and about 40 Å. In another example, top magnetic layer 228 is a top ferromagnetic layer comprised of CoFeB. Top magnetic layer 228, in this embodiment, has a magnetization direction which is free to be switched, for example by a spin transfer process when device 200 receives a critical current required to switch the magnetization direction of the top magnetic layer.

In another example, the top magnetic layer 228 may be comprised of a single ferromagnetic metal or alloy layer, or the layer 228 may be comprised of multiple layers. In one example, the top magnetic layer 228 has a thickness smaller than bottom magnetic layer 222.

In one example, the top electrode 232 is comprised of a nonmagnetic metal such as aluminum or titanium or alloys thereof. In one example, top electrode 232 is operably coupled to an output current lead 208 for passing an output current $I_{out}$ (e.g., shown by outbound arrow $I_{out}$) and a top voltage lead 210. Other applicable configurations of the leads for top electrode 232 are within the scope of the present disclosure. In yet another example, top electrode 232 may be configured to receive a refresh current greater than the critical current to place the magnetization alignment of the top and bottom magnetic layers to an initial state.

FIG. 2B illustrates a cross-sectional view of magnetic logic device 200 along a line A-A' in FIG. 2A in accordance with an embodiment of the present disclosure. Leads 204, 206, 208, 210, and 212 along with corresponding currents or voltages are schematically illustrated by inbound and outbound arrows.

The various structures of device 200 described above may be formed by various applicable techniques, such as deposition, pattern, and/or etch techniques. In one example, sputtering, deposition, e-beam lithography, photolithography, and ion milling techniques may be used. Layers 220, 222, 224, 226, 228, 230, and 232 may each be fabricated into elliptical or oval shapes to form an elliptical or oval-shaped pillar.

As noted above, top magnetic layer 228, in this embodiment, has a magnetization direction which is free to be switched by a spin transfer process. For example, input currents are received through bottom electrode 220 and pass in a perpendicular direction through a plane of bottom and top magnetic layers 222, 228 to top electrode 232. Bottom magnetic layer 222 polarizes the spin of the electrons that are transmitted through the layer, and this flow of incoming spins transfers the transverse part of the spin angular momentum to the local magnetization of the top magnetic layer 228. When the currents are sufficiently large, they pump a precessional motion of the top magnetic layer 228 magnetization, which can be switched to either parallel or antiparallel to the bottom magnetic layer 222 magnetization, depending on the magnitude and polarity of the currents. Thus, a magnetization alignment of the bottom and top magnetic layers may be parallel (i.e., a common direction) or antiparallel (i.e., opposite directions).

Accordingly, a voltage output between bottom and top electrodes 220, 232 is dependent upon the input currents $I_{in1}$ and $I_{in2}$ to the bottom electrode 232 and the magnetization alignment of the bottom and top magnetic layers 222, 228, which then affects the magnetoresistance of the nonmagnetic layer 224 between the bottom and top magnetic layers 222, 228 and thus the output voltage from device 200. When a magnetization alignment of the bottom and top magnetic layers is antiparallel, the magnetoresistance of the nonmagnetic layer is large, resulting in a high output voltage. When a magnetization alignment of the bottom and top magnetic layers is parallel, the magnetoresistance of the nonmagnetic layer is small, resulting in a low output voltage. Thus, the output voltage between bottom and top electrodes 220, 232 may follow an AND gate logic or an OR gate logic. In one example, the input currents may include either positive or negative currents and the output voltage may include either positive or negative voltages.

Referring now to FIGS. 3A-3L, a magnetic device is illustrated at various stages of fabrication showing method of fabrication 100 in accordance with an embodiment of the present disclosure.

Figure 3A:
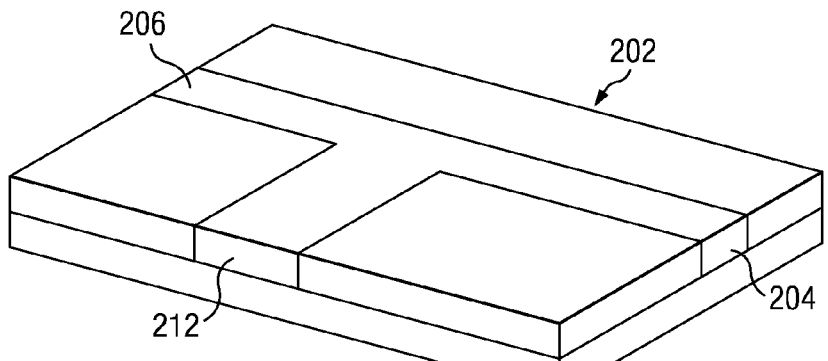
FIGS. 3A-3M illustrate a fabrication method of a magnetic device in accordance with an embodiment of the present disclosure.

FIG. 3A illustrates providing of a substrate 202, including leads 204, 206, and 212.

Figure 3B:
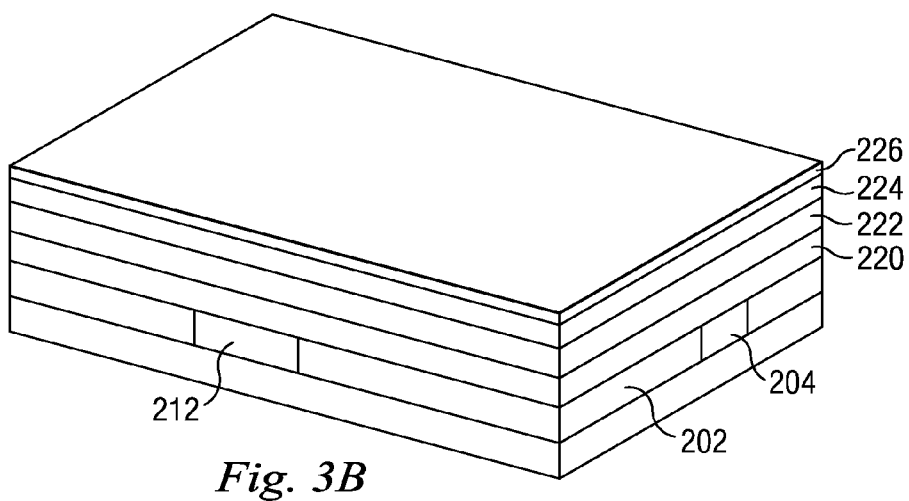

FIG. 3B illustrates depositing of a bottom electrode layer 220 over the substrate 202, depositing of a bottom magnetic layer 222 over the bottom electrode layer 220, depositing of a nonmagnetic layer 224 over the bottom magnetic layer 222, and depositing of a passive layer 226 over the nonmagnetic layer 224. Layers 220, 222, 224, and 226 may be formed or deposited by various applicable means and methods, such as physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof, and using any suitable equipment or apparatus, such as a deposition/reaction chamber, power sources, impedance matching units, heating elements, pumps, and the like.

Figure 3C:
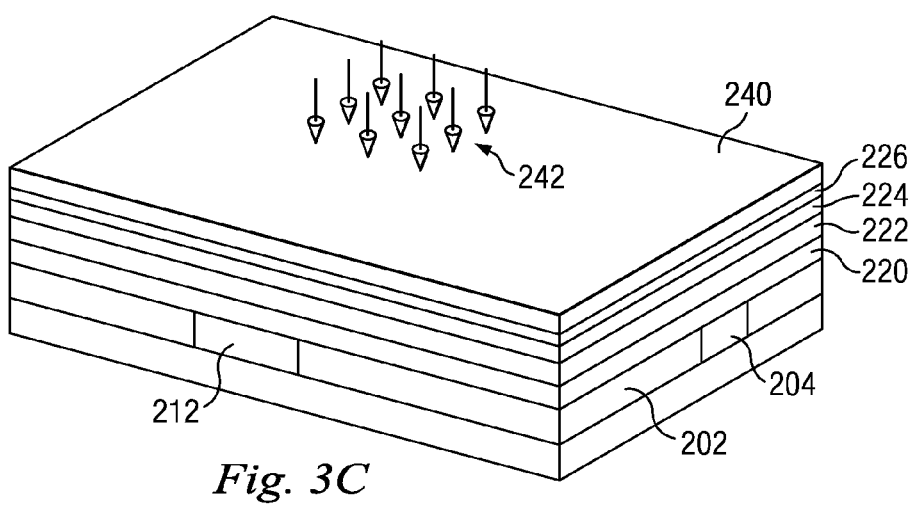

FIG. 3C illustrates depositing of a first photoresist layer 240 over the passive layer 226 and then exposing the photoresist layer 226 to a pattern of intense light using photolithography means and methods, as shown by arrows 242.

Figure 3D:
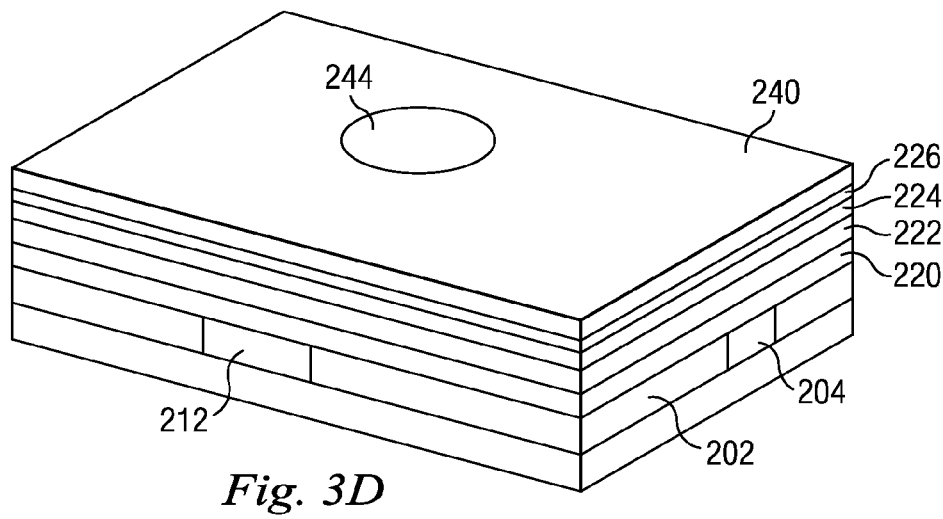

FIG. 3D illustrates exposing a first elliptical pattern 244 onto the first photoresist layer 244 and then developing the photoresist layer 244 to remove the photoresist outside of the first elliptical pattern 244.

Figure 3E:
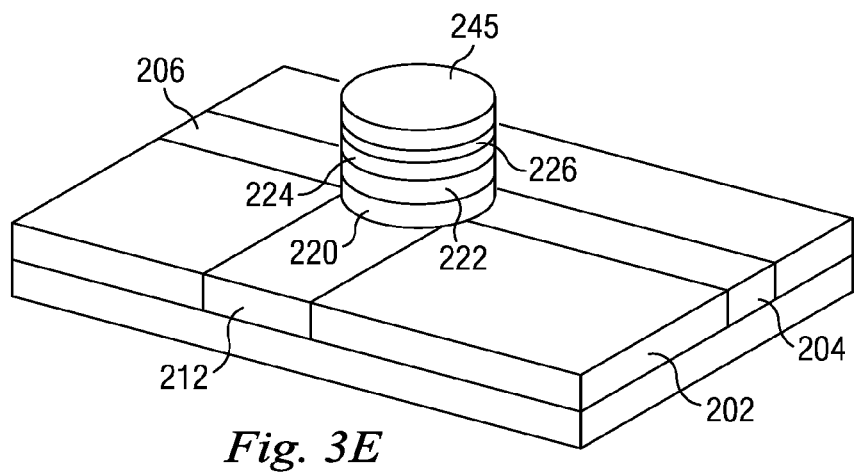

FIG. 3E thus illustrates an elliptical column 245 patterned in the first photoresist layer, and then removing of the passive layer 226, the nonmagnetic layer 224, the bottom magnetic layer 222, and the bottom electrode layer 220 outside the elliptical column 245, for example by an applicable etch process. A dry or wet etch may be used, and in one example the layers 220, 222, 224, and 226 not protected by elliptical column 245 are dry etched to form a first elliptical pillar.

Figure 3F:
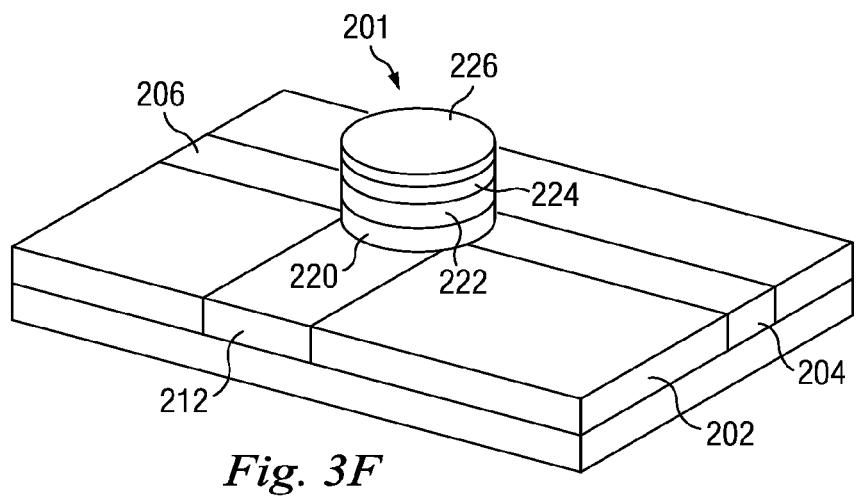

FIG. 3F illustrates a first elliptical pillar 201 after removal of elliptical column 245 comprised of photoresist. Elliptical column 245 may be removed by applicable means and techniques for removal of photoresist, such as by liquid stripping and/or ashing.

Figure 3G:
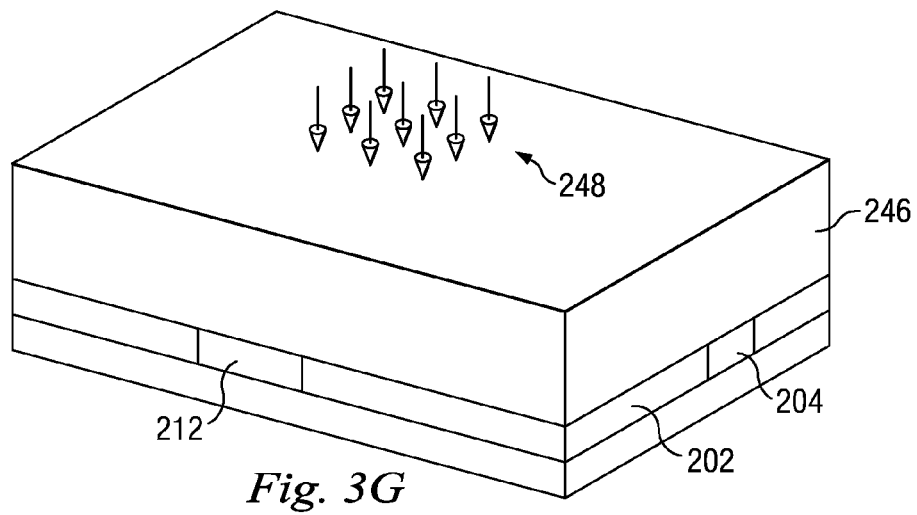

FIG. 3G illustrates depositing of a second photoresist layer 246 over the first elliptical pillar 201 and then exposing the second photoresist layer 246 to a pattern of intense light using photolithography means and methods, as shown by arrows 248.

Figure 3H:
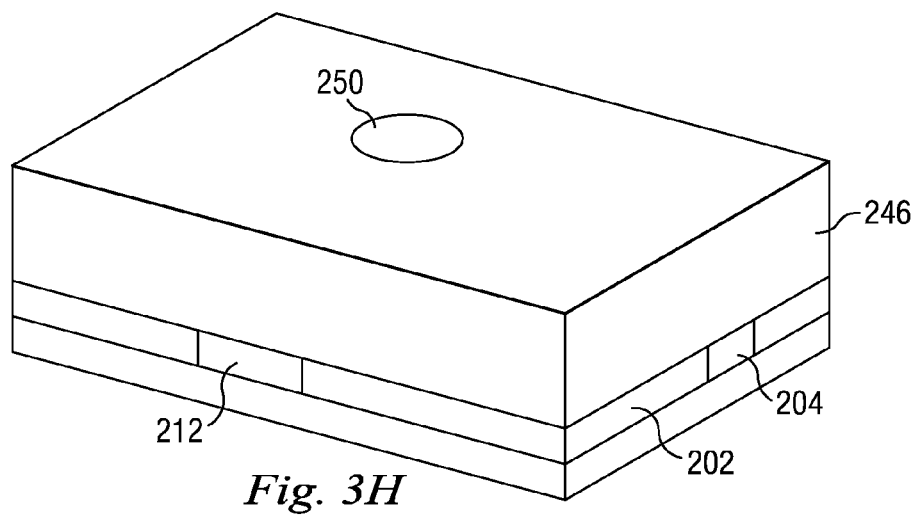

FIG. 3H illustrates exposing a second elliptical pattern 250 onto the second photoresist layer 246 and then developing the photoresist layer 246 to remove the exposed photoresist within the second elliptical pattern 244. The second elliptical pattern 250 is exposed concentrically over the first elliptical pillar 201. The second elliptical pattern 250 has smaller major and minor axes than the first elliptical pattern 244.

Figure 3I:
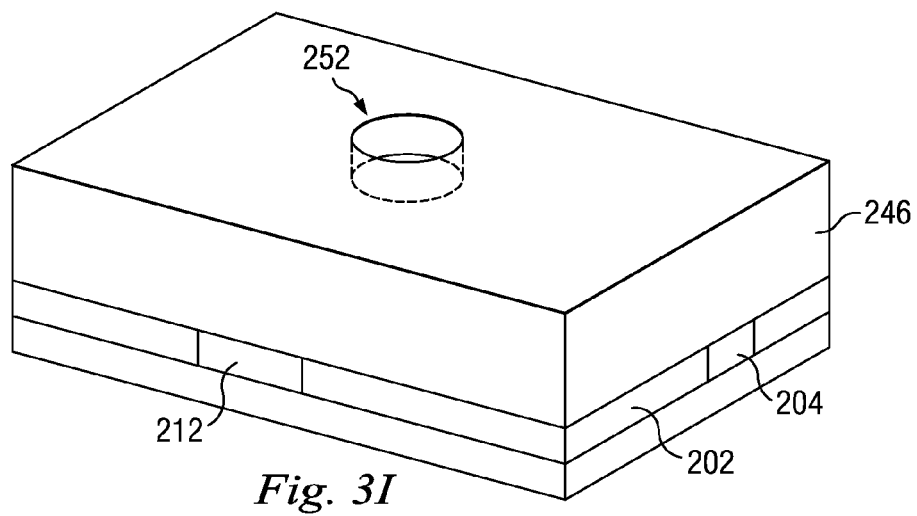

FIG. 3I thus illustrates an elliptical column aperture 252 patterned in the second photoresist layer 246, the elliptical column aperture concentrically disposed over the first elliptical pillar 201.

Figure 3J:
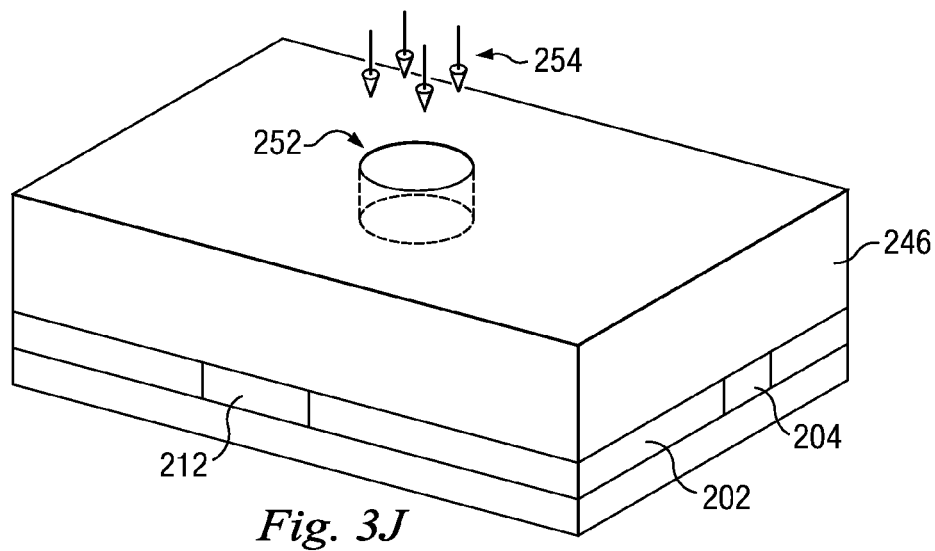

FIG. 3J then illustrates etching of the passive layer 226 through the elliptical column aperture 252, as shown by arrows 254. The etch of the passive layer 226 may be performed by various applicable etch techniques and means, for example as described above.

Figure 3K:
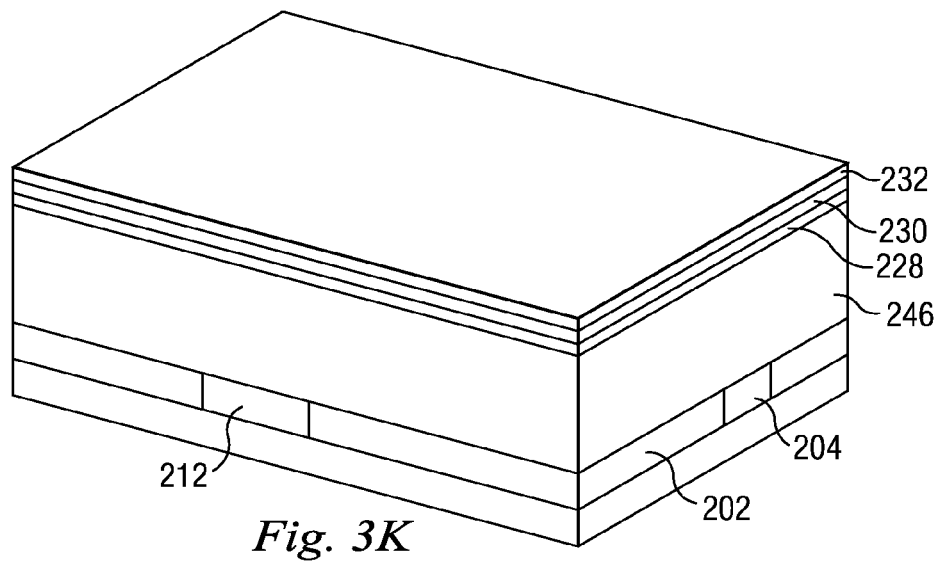

FIG. 3K illustrates depositing of a top magnetic layer 228, a capping layer 230, and a top electrode layer 232 within the elliptical column aperture 252. Accordingly, the top magnetic layer 228 may be deposited to be in direct contact with the nonmagnetic layer 224 through an aperture 227 (FIG. 2B) in the passive layer 226. Layers 228, 230, and 232 may be formed or deposited by various applicable means and methods, for example as described above.

Figure 3L:
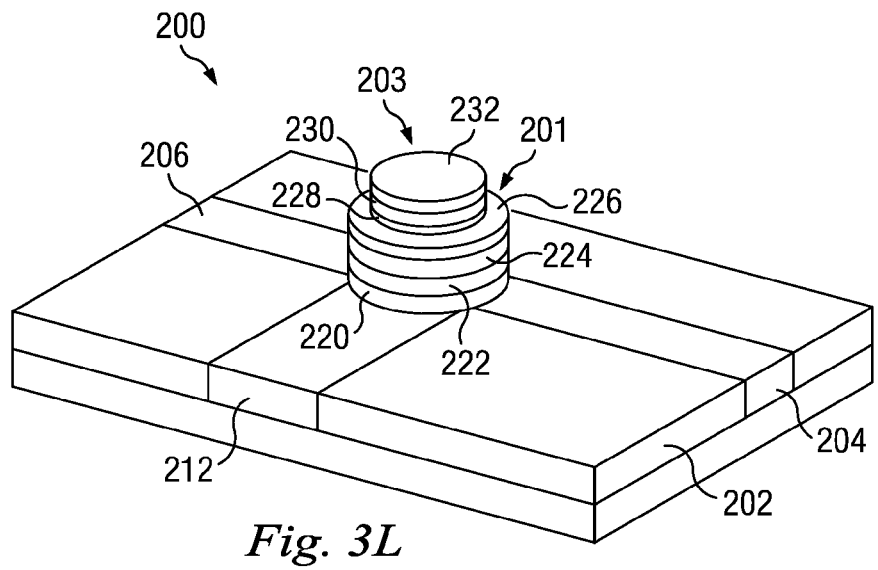

FIG. 3L then illustrates removing of the top electrode layer 232, the capping layer 230, the top magnetic layer 228, and the second photoresist layer 246 outside the elliptical column aperture 252 to form a second elliptical pillar 203 concentrically disposed over the first elliptical pillar 201. The second elliptical pillar 203 has smaller major and minor axes than the first elliptical pillar 201.

Figure 3M:
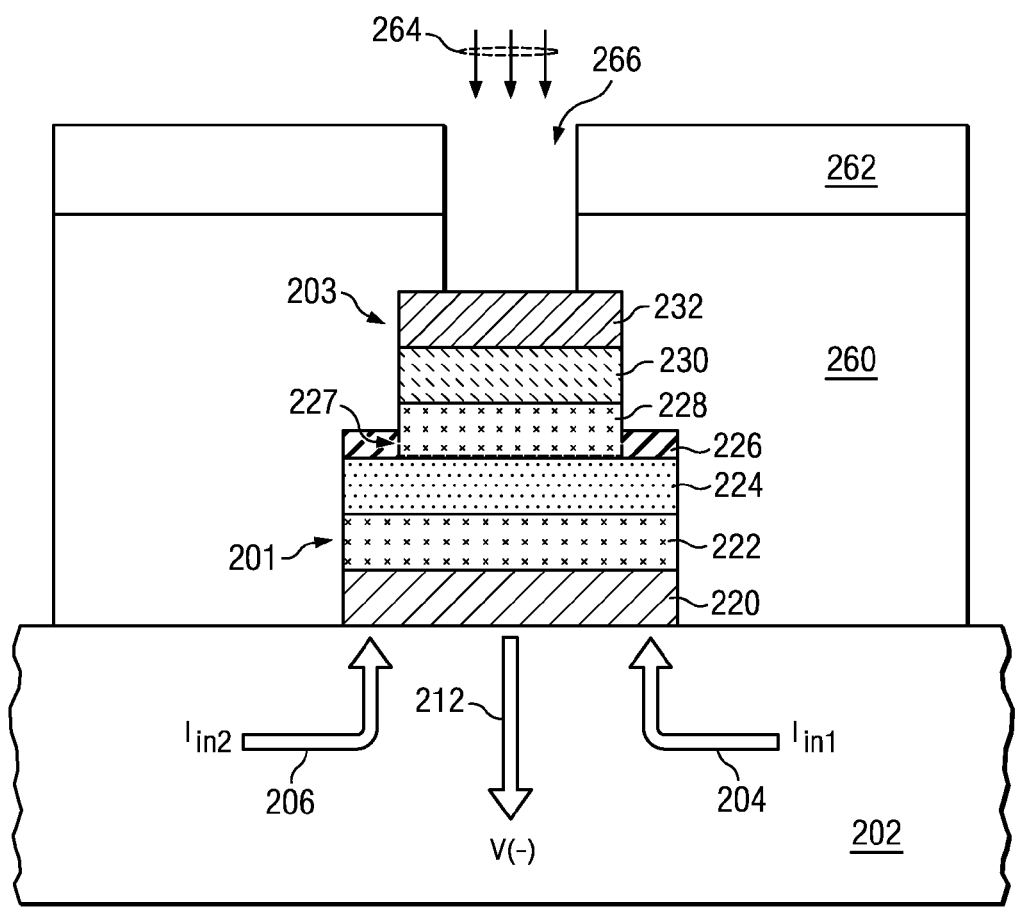

FIG. 3M then illustrates method 130 of FIG. 1B, in which a second passive layer 260 is deposited over the second elliptical pillar 203 and the first elliptical pillar 201. A third photoresist layer 262 is then deposited over the second passive layer 260, and a window 266 is patterned in the third photoresist layer 262 and the second passive layer 260 over the second elliptical pillar 206. Window 266 may be patterned using photolithography/etch means and methods, as shown by arrows 264. A top electrode layer may then be deposited within the window 266 for contacting top electrode layer 232.

Advantageously, the present disclosure provides for magnetic devices, such as magnetic memory devices or logic devices, and methods of fabricating such devices without the use of a hard mask and etch, thus providing devices with improved consistency of elliptical pillar shape and improved yield.

Thus, the present disclosure provides for magnetic devices and methods of fabricating such a device. In one embodiment, a magnetic device includes a first elliptical pillar of first material layers; a second elliptical pillar concentrically disposed over the first elliptical pillar, the second elliptical pillar includes second material layers. The second elliptical pillar is smaller than the first elliptical pillar in size.

According to another embodiment, a magnetic device includes a first elliptical pillar and a second elliptical pillar concentrically disposed over the first elliptical pillar. The magnetic device further includes a passive layer disposed on the second elliptical pillar and contacting sidewall of the first elliptical pillar. The first elliptical pillar includes a bottom magnetic layer, and a nonmagnetic layer disposed over the bottom magnetic layer. The second elliptical pillar is smaller than the first elliptical pillar in size and includes a top magnetic layer disposed over the nonmagnetic layer.

According to another embodiment, a method of fabricating a magnetic device includes depositing a first set of material layers over a substrate and a passive layer on the first set of material layers; patterning the first set of material layers and the passive layer to form a first elliptical pillar; forming a photoresist layer over the first elliptical pillar, wherein the photoresist layer has an elliptical column aperture concentrically positioned over the first elliptical pillar; etching the passive layer through the elliptical column aperture; and forming a second set of material layers within the elliptical column aperture to form a second elliptical pillar concentrically disposed over the first elliptical pillar.

According to another embodiment, a method of fabricating a magnetic device is provided. The method includes providing a substrate, and then depositing a bottom electrode layer over the substrate, a bottom magnetic layer over the bottom electrode layer, a nonmagnetic layer over the bottom magnetic layer, and a passive layer over the nonmagnetic layer. The method further includes etching the bottom electrode layer, the bottom magnetic layer, the nonmagnetic layer, and the passive layer to form a first elliptical pillar. A photoresist layer is then deposited over the first elliptical pillar, and an elliptical column aperture is patterned in the photoresist layer, the elliptical column aperture concentrically disposed over the first elliptical pillar. The passive layer is then etched through the elliptical column aperture, and a top magnetic layer, a capping layer, and a top electrode layer is deposited within the elliptical column aperture. The top electrode layer, the capping layer, the top magnetic layer, and the photoresist layer outside the elliptical column aperture are then removed to form a second elliptical pillar concentrically disposed over the first elliptical pillar.

According to another embodiment, a method includes providing a substrate, depositing a bottom electrode layer over the substrate, depositing a bottom magnetic layer over the bottom electrode layer, depositing a nonmagnetic layer over the bottom magnetic layer, depositing a passive layer over the nonmagnetic layer, depositing a first photoresist layer over the passive layer, patterning an elliptical column in the first photoresist layer, and then removing the passive layer, the nonmagnetic layer, the bottom magnetic layer, and the bottom electrode layer outside the elliptical column to form a first elliptical pillar. The method further includes depositing a second photoresist layer over the first elliptical pillar, patterning an elliptical column aperture in the second photoresist layer, the elliptical column aperture concentrically disposed over the first elliptical pillar, etching the passive layer through the elliptical column aperture, depositing a top magnetic layer, a capping layer, and a top electrode layer within the elliptical column aperture, and then removing the top electrode layer, the capping layer, the top magnetic layer, and the second photoresist layer outside the elliptical column aperture to form a second elliptical pillar concentrically disposed over the first elliptical pillar.

In yet another embodiment, a magnetic device includes a first elliptical pillar including a bottom electrode, a bottom magnetic layer disposed over the bottom electrode, a nonmagnetic layer disposed over the bottom magnetic layer, and a passive layer disposed over the nonmagnetic layer. The magnetic device further includes a second elliptical pillar concentrically disposed over the first elliptical pillar, the second elliptical pillar including a top magnetic layer disposed over the nonmagnetic layer, a capping layer disposed over the top magnetic layer, and a top electrode disposed over the capping layer.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A magnetic device, comprising:
   a first pillar of first material layers, wherein the first material layers have an elliptical shape and include a bottom magnetic layer, a nonmagnetic layer disposed over the bottom magnetic layer, and a passive layer disposed over the nonmagnetic layer;
   a second pillar concentrically disposed over the first pillar, the second pillar including second material layers, wherein the second material layers have an elliptical shape and include a top magnetic layer disposed over the nonmagnetic layer, and a capping layer disposed over the top magnetic layer,
   wherein the second material layers have major and minor axes smaller than the major and minor axes of the first material layer.

2. The magnetic device of claim 1, wherein the first material layers further include an antimagnetic layer adjacent the bottom magnetic layer.

3. The magnetic device of claim 1, wherein the first material layers further include a bottom electrode underlying the bottom magnetic layer.

4. The magnetic device of claim 3, further comprising
   a substrate including a first input current lead, a second input current lead, and a bottom voltage lead;
   a bottom buffer layer disposed over the bottom electrode; and
   an antimagnetic layer disposed over the bottom buffer layer.

5. The magnetic device of claim 1, wherein the second material layers further include a top electrode disposed over the capping layer.

6. The magnetic device of claim 1, wherein the passive layer contacts a sidewall of the second pillar.

7. A magnetic device, comprising:
   a first pillar including first material layers having an elliptical shape and including:
      a bottom magnetic layer, and
      a nonmagnetic layer disposed over the bottom magnetic layer;
   a second pillar including second material layers having an elliptical shape and concentrically disposed over the first pillar,
   wherein the second material layers have major and minor axes smaller than the major and minor axes of the first material layers and include a top magnetic layer disposed over the nonmagnetic layer; and
   a passive layer disposed on the second pillar and contacting a sidewall of the first pillar.

8. The magnetic device of claim 7, wherein the first material layers further include an antimagnetic layer underlying the bottom magnetic layer.

9. The magnetic device of claim 8, wherein
   the first pillar further includes a bottom electrode underlying the antimagnetic layer, and
   the second pillar further includes a capping layer disposed over the top magnetic layer and a top electrode disposed over the capping layer.

10. The device of claim 7, wherein the bottom magnetic layer is a pinned ferromagnetic layer having a thickness between about 20 angstroms and about 80 angstroms, and wherein the top magnetic layer is a free ferromagnetic layer having a thickness between about 10 angstroms and about 40 angstroms.

11. The device of claim 7, wherein the nonmagnetic layer is comprised of an insulator material or a metal having a thickness between about 6 angstroms and about 30 angstroms.

12. The device of claim 7, wherein the passive layer is comprised of a dielectric material having a thickness between about 2 angstroms and about 5 angstroms.

13. The device of claim 7, wherein the top magnetic layer is in direct contact with the nonmagnetic layer through an aperture in the passive layer.

14. The device of claim 7, wherein the top magnetic layer has a thickness greater than the passive layer.

15. A magnetic device, comprising:
   a first pillar including first material layers having an elliptical shape and including:
      a bottom magnetic layer, and
      a nonmagnetic layer disposed over the bottom magnetic layer; and
   a second pillar including second material layers having an elliptical shape and concentrically disposed over the first pillar,
   wherein the second material layers have major and minor axes smaller than the major and minor axes of the first material layers and include a top magnetic layer disposed over the nonmagnetic layer.

16. The magnetic device of claim 15, wherein the first material layers further include an antimagnetic layer adjacent the bottom magnetic layer.

17. The magnetic device of claim 15, wherein the first material layers further include a bottom electrode underlying the bottom magnetic layer.

18. The magnetic device of claim 17, further comprising
   a substrate including a first input current lead, a second input current lead, and a bottom voltage lead;
   a bottom buffer layer disposed over the bottom electrode; and
   an antimagnetic layer disposed over the bottom buffer layer.

19. The magnetic device of claim 15, wherein the second material layers further include a top electrode disposed over a capping layer disposed over the top magnetic layer.

* * * * *